United States Patent [19]
Matsubara et al.

[11] Patent Number: 6,149,730
[45] Date of Patent: Nov. 21, 2000

[54] APPARATUS FOR FORMING FILMS OF A SEMICONDUCTOR DEVICE, A METHOD OF MANUFACTURING A SEMICONDUCTOR DEVICE, AND A METHOD OF FORMING THIN FILMS OF A SEMICONDUCTOR

[75] Inventors: Yoshihisa Matsubara; Manabu Iguchi; Kazuhiko Endo, all of Tokyo, Japan

[73] Assignee: NEC Corporation, Tokyo, Japan

[21] Appl. No.: 09/168,080

[22] Filed: Oct. 8, 1998

[30] Foreign Application Priority Data

Oct. 8, 1997 [JP] Japan ................................ 9-275435

[51] Int. Cl.⁷ .............................. C23C 16/00; H05H 1/00
[52] U.S. Cl. .................. 118/728; 118/723 E; 118/723 I; 118/719; 156/345
[58] Field of Search .................... 118/719, 720, 118/721, 723 E, 715; 156/345

[56] References Cited

U.S. PATENT DOCUMENTS

| | | | |
|---|---|---|---|
| 5,505,779 | 4/1996 | Mizuno et al. | 118/719 |
| 5,902,461 | 5/1999 | Xu et al. | 118/721 |
| 5,919,332 | 7/1999 | Koshiishi et al. | 118/723 E |

FOREIGN PATENT DOCUMENTS

| | | |
|---|---|---|
| 1-196833 | 8/1989 | Japan . |
| 4-368119 | 12/1992 | Japan . |
| 5-326719 | 12/1993 | Japan . |
| 6-208959 | 7/1994 | Japan . |
| 8-227934 | 9/1996 | Japan . |
| 8-321694 | 12/1996 | Japan . |
| 9-237783 | 9/1997 | Japan . |
| 10-189578 | 7/1998 | Japan . |
| 11-012744 | 1/1999 | Japan . |
| 11-145085 | 5/1999 | Japan . |

*Primary Examiner*—Gregory Mills
*Assistant Examiner*—Parviz Hassanzadeh
*Attorney, Agent, or Firm*—Sughrue, Mion, Zinn, Macpeak & Seas, PLLC

[57] ABSTRACT

In an apparatus for forming a film of a semiconductor device in which chemical vapor deposition is used to accumulate insulation films such as a carbon-compound film and a silicon-oxide or silicon-nitride film on a silicon substrate, it is possible to prevent the peel-off of the silicon-oxide film in the circumferential area of the silicon substrate.

The apparatus includes a chamber including a holder to hold the substrate, a ring-shaped member to grasp the substrate in cooperation with the holder, and a reactive gas supplier to supply a predetermined type of reactive gas to the chamber. The member dimensionally has an inside diameter smaller than an outside diameter of the holder and an outside diameter larger than that of the holder. During the film forming process with the reactive gas, the member concentrically covers a circumferential region of a surface of the substrate.

16 Claims, 8 Drawing Sheets

106 SAMPLE
107 SAMPLE HOLDER
108 BIAS HIGH-FREQUENCY POWER SOURCE
110 COOLING MEDIUM FOR WATER COOLING SYSTEM
111 RING-SHAPED MEMBER

401 SAMPLE HOLDER
402 2ND ELECTRODE
403 BIAS HIGH-FREQUENCY POWER SOURCE1
404 BIAS HIGH-FREQUENCY POWER SOURCE2
405 COOLING MEDIUM FOR WATER COOLING SYSTEM
406 SAMPLE

FIG. 1

101 HIGH FREQUENCY POWER SOURCE
102 QUARTZ BELL JAR
103 ANTENNA
104 MATERIAL GAS
105 PERMANENT MAGNET
106 SAMPLE
107 SAMPLE HOLDER
108 BIAS HIGH-FREQUENCY POWER SOURCE
109 ELECTROMAGNET
110 COOLING MEDIUM FOR WATER COOLING SYSTEM
111 RING-SHAPED MEMBER

FIG. 2

106 SAMPLE
107 SAMPLE HOLDER
108 BIAS HIGH-FREQUENCY POWER SOURCE
110 COOLING MEDIUM FOR WATER COOLING SYSTEM
111 RING-SHAPED MEMBER

FIG. 3

106 SAMPLE
107 SAMPLE HOLDER
108 BIAS HIGH-FREQUENCY POWER SOURCE
110 COOLING MEDIUM FOR WATER COOLING SYSTEM
111 RING-SHAPED MEMBER

FIG. 4

401 SAMPLE HOLDER
402 2ND ELECTRODE
403 BIAS HIGH-FREQUENCY POWER SOURCE1
404 BIAS HIGH-FREQUENCY POWER SOURCE2
405 COOLING MEDIUM FOR WATER COOLING SYSTEM
406 SAMPLE

FIG. 5
PRIOR ART

501 1ST CHAMBER
502 2ND CHAMBER
507 SAMPLE HOLDER
513 TRANSPORT CHAMBER
514 INTERLOCK

FIG. 6

PRIOR ART

601 HIGH FREQUENCY POWER SOURCE
602 QUARTZ BELL JAR
603 ANTENNA
604 MATERIAL GAS
605 PERMANENT MAGNET
606 SAMPLE
607 SAMPLE HOLDER
608 BIAS HIGH-FREQUENCY POWER SOURCE
609 ELECTROMAGNET
610 COOLING MEDIUM FOR WATER COOLING SYSTEM

FIG. 8

APPARATUS FOR FORMING FILMS OF A SEMICONDUCTOR DEVICE, A METHOD OF MANUFACTURING A SEMICONDUCTOR DEVICE, AND A METHOD OF FORMING THIN FILMS OF A SEMICONDUCTOR

BACKGROUND OF THE INVENTION

The present invention relates to a film forming apparatus for use in a semiconductor manufacturing process, and in particular, to an apparatus for forming films, a method of fabricating a semiconductor in a semiconductor manufacturing process of forming a film of silicon oxide, a film of silicon nitride, and a coating film primarily including carbon.

Description of the Prior Art

Recent development of integration of large-scale integrated semiconductor circuits has resulted in a complex wiring structure to establish connections between the respective constituent elements of the semiconductor circuits.

To prevent wires from intersecting each other, when there is formed a detour for wires, an area occupied by the wiring is increased in relation to a chip area. Furthermore, the total length of wiring becomes longer, which leads to a problem of signal transmission delay through the wire regions.

In consequence, it is generally employed a technology, called "multi-layer wiring" in which an insulation film or layer is inserted between wiring layers to form a multi-layer wiring structure to thereby prevent intersections between wiring layers.

In the multi-layer wiring technology, it is essential to minimize capacity between wiring regions in each layer and capacity between vertically arranged wiring layers. In other words, the increase in the capacity between wiring layers causes a signal transfer delay through the wiring regions. When a signal containing a high-frequency component is propagated through two wiring regions vertically disposed with an insulating film therebetween, there possibly occurs a phenomenon of crosstalk between the wiring regions, which leads to a wrong operation.

In consideration of the technological background described above, there has been discussed a technology to employ as an insulation thin film between layers a film having a small value of specific inductive capacity $\epsilon r$ in place of such materials of insulation films broadly utilized in the large scale integration (LSI) technology as $Si_3N_4$ ($\epsilon r$ is about 7) and $SiO_2$ ($\epsilon r$ is about 3.9). Attention has been directed to a film of amorphous carbon fluoride as such a substance.

For example, in accordance with the Japanese Patent Application Serial No. 08-321694, an amorphous carbon fluoride is used as a material having a low specific inductive capacity.

Since the carbon-fluoride film is easily etched by an oxygen gas in a plasma state, it is impossible to fabricate an ordinary through-hole using resist. Consequently, in the article above, a film of silicon oxide or nitride is formed at least on an upper surface of the film of amorphous carbon fluoride to manufacture a laminated structure of "silicon-oxide layer/carbon-fluoride layer/silicon-oxide layer" or "silicon-oxide layer/carbon-fluoride layer/silicon-nitride layer". The silicon-oxide layer or the silicon-nitride layer is adopted as a cover film against the oxygen plasma gas as well as a smoothening or flattening insulation film in a chemical machine polishing (CMP) process.

Figure 8:
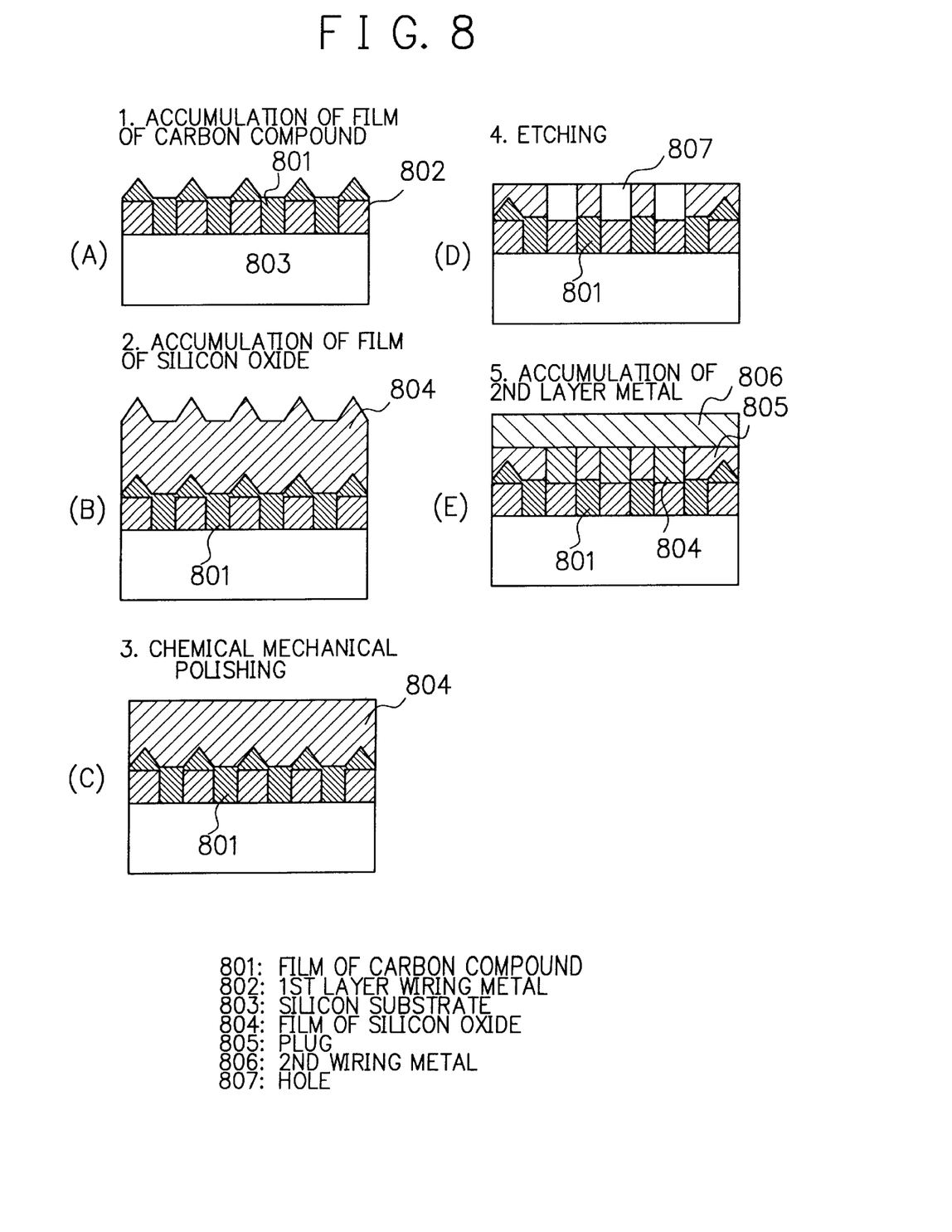
FIG. 8 is a diagram briefly showing a multi-layer wiring structure using an insulating layer of carbon compound and a film of silicon oxide in a semiconductor in accordance with the present invention.

Referring now to FIG. 8, description will be given of an outline of the method of fabricating a semiconductor device using a carbon-compound film.

First, a carbon-compound film 802 is accumulated between wiring metal regions 801. This process is achieved through chemical-vapor deposition (CVD) with a gas of carbon fluoride such as $C_4F_8$. In this operation, a bias power of several tens of watts is applied to a substrate to grow a film of amorphous carbon fluoride between fine wiring regions or layers.

Additionally, between a base silicon substrate 803 and the carbon layer 801 and between the wiring metal region 802 and the carbon layer 801, there is accumulated a film of silicon oxide including excessive amount of silicon in its composition. This increases the fixing force therebetween, namely, these regions are tightly fixed onto each other.

Next, a film of silicon oxide 804 is accumulated on the carbon layer 802. Also in this process, a film of silicon oxide including excessive amount of silicon in its composition is grown between the carbon layer and the film of silicon oxide to increase the fixing force therebetween.

Subsequently, the film of silicon oxide is subjected to a chemical mechanical polishing process to smooth an upper surface thereof. Furthermore, the film of silicon oxide and the carbon-compound film are etched by the known lithography to accumulate a known plug metal 805 such as aluminum in holes 807 thus opened. Thereafter, a second-layer metal 806 is accumulated thereon to resultantly form a multi-layer wiring structure.

It can be naturally considered that more than two layers of wiring are fabricated by repeatedly conducting the process described above.

Figure 6:
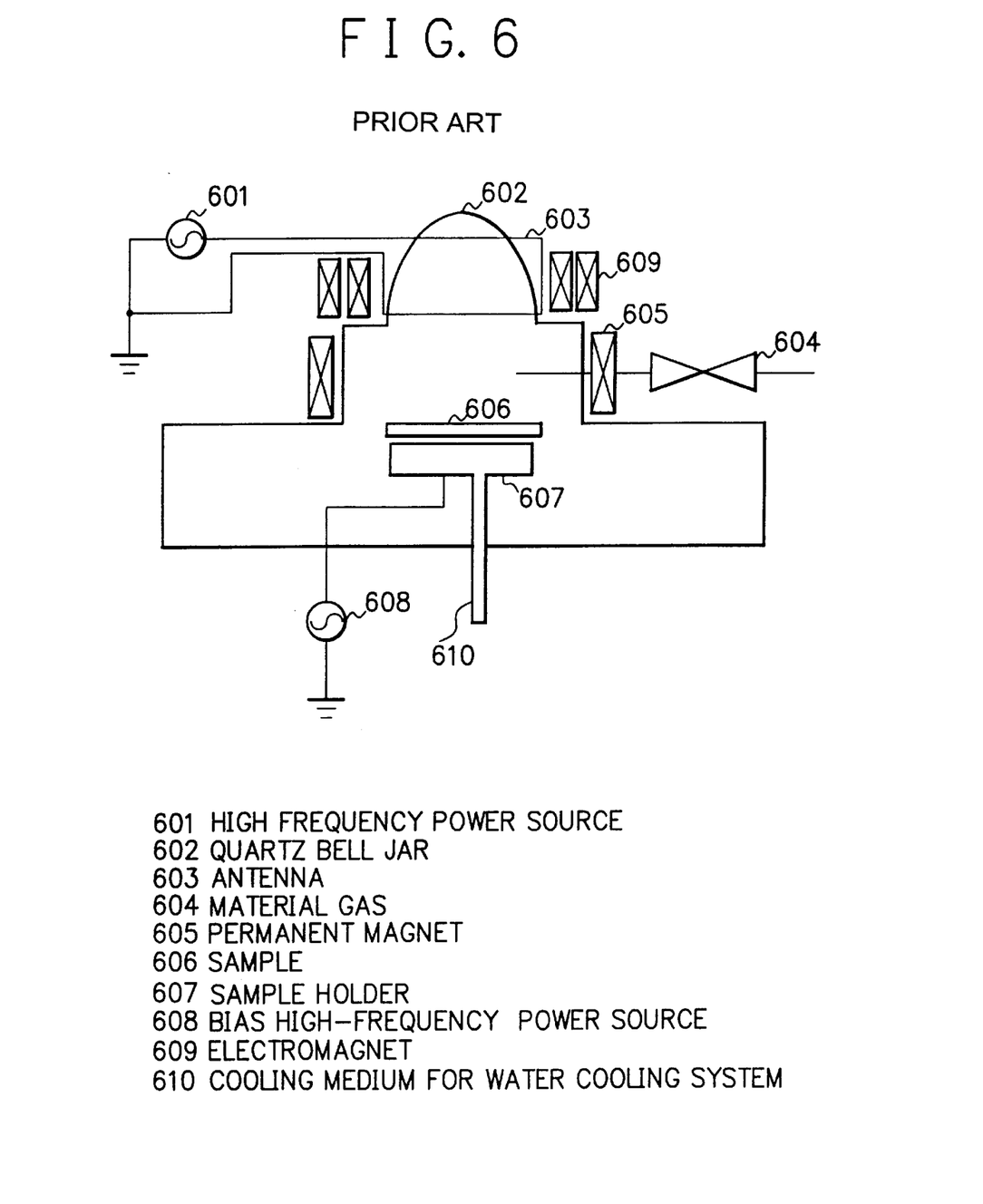
FIG. 6 is a side view showing an overall configuration of a conventional CVD system.

FIG. 6 shows a general example of a film forming apparatus to fabricate a film of amorphous carbon fluoride and a film of silicon oxide.

The configuration of this apparatus includes a sample holder 607 also serving as a lower electrode and a silicon wafer 606 placed thereon. In this regard, when a material other than silicon exists at least on a portion of its surface, the item is called a silicon wafer so as to be discriminated from a silicon substrate. In this specific example, an electrostatic chuck is employed as the sample holder 607.

In general, a gas of helium is ejected onto a rear surface of the silicon wafer 606 from the sample holder 607 cooled by a water-cooling machine to increase the thermal conductivity of the substrate. Consequently, heat of the substrate is imparted to the sample holder 607, which resultantly cools the substrate.

In the structure, there is provided a high-frequency bias power source 608 to apply a high-frequency power to the sample holder 607 independently of the plasma source.

By applying a high-frequency wave to the sample holder 607, it is possible to effectively apply a negative bias to the silicon wafer 606. Namely, the ion energy can be controlled, for example, to improve the characteristic of embedding.

In the conventional apparatus shown in FIG. 6, since the plasma is generated by a Helicon wave. Specifically, a high-frequency wave is introduced from a high-frequency power source 601 onto an antenna 603 arranged on an outer circumference of a quartz chamber 602 to efficiently generate magnetic fields of a permanent magnet 605 and an electromagnet 609, which are also arranged on an outer circumference of a quartz chamber 602, so as to generate plasma in the chamber 602.

It is natural to be appreciated that the discharging process to form the carbon-compound film and/or the film of silicon oxide is not limited to the Helicon wave process. Heretofore, there have been already employed the electron cyclotron resonance, the inductive coupling, and the capacity coupling for the discharge process.

In addition, for example, as described in the Japanese Patent Laid-Open Serial No. 4-368119, there has been proposed a technology of forming films of a semiconductor device in which members existing in the neighborhood of a substrate to be processed are rough finished to have coarse surfaces. This prevents a coating film and the like fixed onto the members from peeling off therefrom. However, there has been no discussion about the problem related to thermal decomposition of the film of amorphous carbon fluoride.

The Japanese Patent Laid-Open Serial No. 6-208959 describes a method of manufacturing a semiconductor device in which a wolfram film is formed by chemical vapor deposition. However, there has not been any discussion about a technology using a film of amorphous carbon fluoride.

In accordance with the conventional technology, generally, in an apparatus to form a thin film of carbon compound, a film of silicon oxide, a film of nitride, and the like, when a holder of an electrostatic chuck type is adopted as the sample holder 607, the holder is restrictively required to have a diameter smaller than that of the silicon wafer 606 in any case because of the following reasons.

That is, in a case in which the employed sample holder 607 of the electrostatic chuck type has a diameter larger than that of the silicon wafer 606, when the film forming process is repeatedly accomplished, the thickness of the film accumulated on the pertinent member becomes greater. This leads to a problem of difficulty in the fixing of the silicon wafer 606 and reduction in the substrate cooling efficiency.

Additionally, there exists a problem of increase in the surface temperature of the sample holder 607 in an area thereof which is exposed to the high-density plasma, and hence the holder 607 is deteriorated.

On the other hand, when the employed sample holder 607 has a diameter smaller than that of the silicon wafer 606, any surface of the holder 607 is not exposed to the high-density plasma and hence the problem above is not to be considered.

However, if the sample holder 607 cannot be brought into contact with the periphery of the silicon waver 606, there arises a problem of decrease in the cooling efficiency of the outer-most periphery of the wafer 606.

When a laminated structure of a combination of "silicon-oxide layer/carbon layer/silicon-oxide layer" or "silicon-oxide layer/carbon layer/silicon-nitride layer" is produced by use of a sample holder described above, a film of silicon nitride or an oxide is ordinarily accumulated and then a carbon-compound layer is formed with the substrate temperature set to about 100° C.

For the carbon film, since the substrate bias is 50 watts (W) or less to improve the embedding characteristic, the temperature of the periphery not cooled is increased at most about 120° C. The film is accumulated on the overall surface of the wafer 606.

Subsequently, a film of silicon nitride or oxide is accumulated on the carbon-compound film. To improve the quality of the accumulated film and the embedding characteristic in the process, when there is adopted a high-density plasma and the substrate temperature is increased up to about 300° C. by a bias power of about one kilowatt (Kw) in the film forming process, the peripheral portion of the wafer 606 is heated to a temperature of more than about 400° C. which the film of amorphous carbon fluoride can withstand.

This resultantly leads to a problem that the film of amorphous carbon fluoride is decomposed and generates gas and hence the film of silicon oxide peels off.

SUMMARY OF THE INVENTION

It is therefore an object of the present invention, which removes the drawbacks of the prior art, to provide an apparatus for manufacturing a semiconductor device using chemical vapor deposition to cumulatively form insulating films such as a film of carbon compound or a film of silicon oxide or nitride in which the film of silicon oxide is prevented from peeling off in the peripheral of the silicon substrate and to provide a film forming apparatus and/or a film forming method in which the film fixed onto the outer circumference of the substrate to be processed is prevented from peeling off, thereby preventing the peel-off of the film of silicon oxide.

To achieve the object above in accordance with the present invention, there are adopted basic technological configurations as follows. Namely, in a first aspect of the present invention, there is provided a film forming apparatus for use in a semiconductor manufacturing process including a chamber in which a carbon compound film between layers and the like are formed on a substrate to be processed. The chamber at least includes a holder section for holding the substrate thereon, a ring-shaped member disposed to oppose to a surface of the holder on a side thereof on which the substrate is mounted, the member grasping the substrate in cooperation with the holder; and reactive gas supplying means for supplying a predetermined type of reactive gas into the chamber. The ring-shaped member dimensionally has an inside diameter smaller than an outside diameter of the holder section and an outside diameter larger than the outside diameter of the holder section. The ring-shaped member concentrically covers, during a film forming process with the reactive gas, a circumferential region of a surface of the substrate mounted on the holder section. In addition, in accordance with a second aspect of the present invention, there is provided a film forming apparatus for use in a semiconductor manufacturing process including a chamber in which a carbon compound film between layers and the like are formed on a substrate to be processed. The chamber at least includes a holder section for holding the substrate thereon and reactive gas supplying means for supplying a predetermined type of reactive gas into the chamber. The holder section includes an electrostatic chuck and the apparatus further includes a second electrode connected to a circumferential edge of the electrostatic chuck.

Moreover, in a third aspect of the present invention, there is provided a semiconductor manufacturing apparatus of a multi-chamber type including at least two chambers including a first chamber and a second chamber for use in a semiconductor manufacturing process, each chamber including, for the formation of an insulating film or the like on a substrate to be processed, a holder section for holding the substrate thereon and reactive gas supply means for supplying reactive gas to an inside of the chamber. The first chamber is employed to form a film of carbon compound between layers and the second chamber is used to form a film of silicon oxide or nitride. The plasma density of the second chamber is less than that of the first chamber.

That is, in the film forming apparatus of the general technological idea of the present invention, when a film of carbon compound is formed between other films by a high-density plasma source, the film forming operation is carried out only in a film forming range such that the film of carbon compound is not formed in areas which are in the periphery of the substrate and which are not brought into contact with the substrate holder and hence is not cooled.

With this provision, even when the temperature of the periphery of the wafer is increased in the process of forming an upper film of silicon oxide, there does not appear substances generated through decomposition and hence the peel-off of the film can be prevented in the periphery of the wafer.

The specific examples for the purposes above include a method of arranging a ring-shaped member which coats in the film forming process the outer circumference of the substrate to be processed and a method of disposing a second electrode, separately with respect to the holder section serving as an electrode, in the outer circumference of the holder section such that the carbon film is not formed in the outer circumference of the holder section. Furthermore, there may be used a process of forming a film of silicon oxide or nitride on a film of carbon compound between other layers in which a manufacturing apparatus including a plasma generator to generate plasma with a low plasma density is used such that the film is accumulated on the carbon-compound film, and even when the carbon-compound film is formed up to the outer-most edge of the substrate, the temperature of the edge becomes equal to the decomposition temperature of the carbon-compound film, thereby preventing the peel-off phenomenon.

That is, in an apparatus for forming a film of carbon compound, there are/is provided in accordance with the present invention an apparatus configuration and/or a film forming method in which the carbon film is not formed in the peripheral region of the silicon wafer.

To prevent the film from being produced in the peripheral region of the substrate as described above in accordance with the present invention, there is specifically used a process in which a ring-shaped member 111 made of quartz is arranged only on the periphery of the wafer to cover the peripheral area thereof. The ring-shaped member has an outside diameter larger than the diameter of the sample holder and an inside diameter smaller than the diameter of the wafer. The member, the holder, and the wafer are concentrically disposed in the apparatus. Thanks to the constitution, the carbon film is partially accumulated on the ring-shaped member and hence not on the wafer in the pertinent peripheral zone.

In another concrete example, a ring-shaped electrode is disposed only in the peripheral of the wafer and a high-frequency power is supplied to the electrode. Resultantly, ions accelerated by the high-frequency power are emitted onto the substrate and the ion sputtering of an accumulated film takes place only in the peripheral of the substrate. When the sputtering speed is substantially equal to or more than the film accumulation speed, the film accumulation does not occur in the peripheral of the wafer.

Alternatively, in accordance with the present invention, there is employed a manufacturing apparatus constructed such that the temperature of the cover film such as a film of silicon oxide is less than the temperature which the film of carbon compound can withstand. For example, as above, there is selectively used sputtering means which intentionally varies the sputtering density. Due to this method, the decomposition of the film of carbon compound is prevented and hence the coated film does not easily peel off in the periphery of the silicon wafer.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Referring next to the accompanying drawings, description will be given in detail of specific configurations of an apparatus for and a method of forming films of a semiconductor device in accordance with the present invention.

Figure 1:
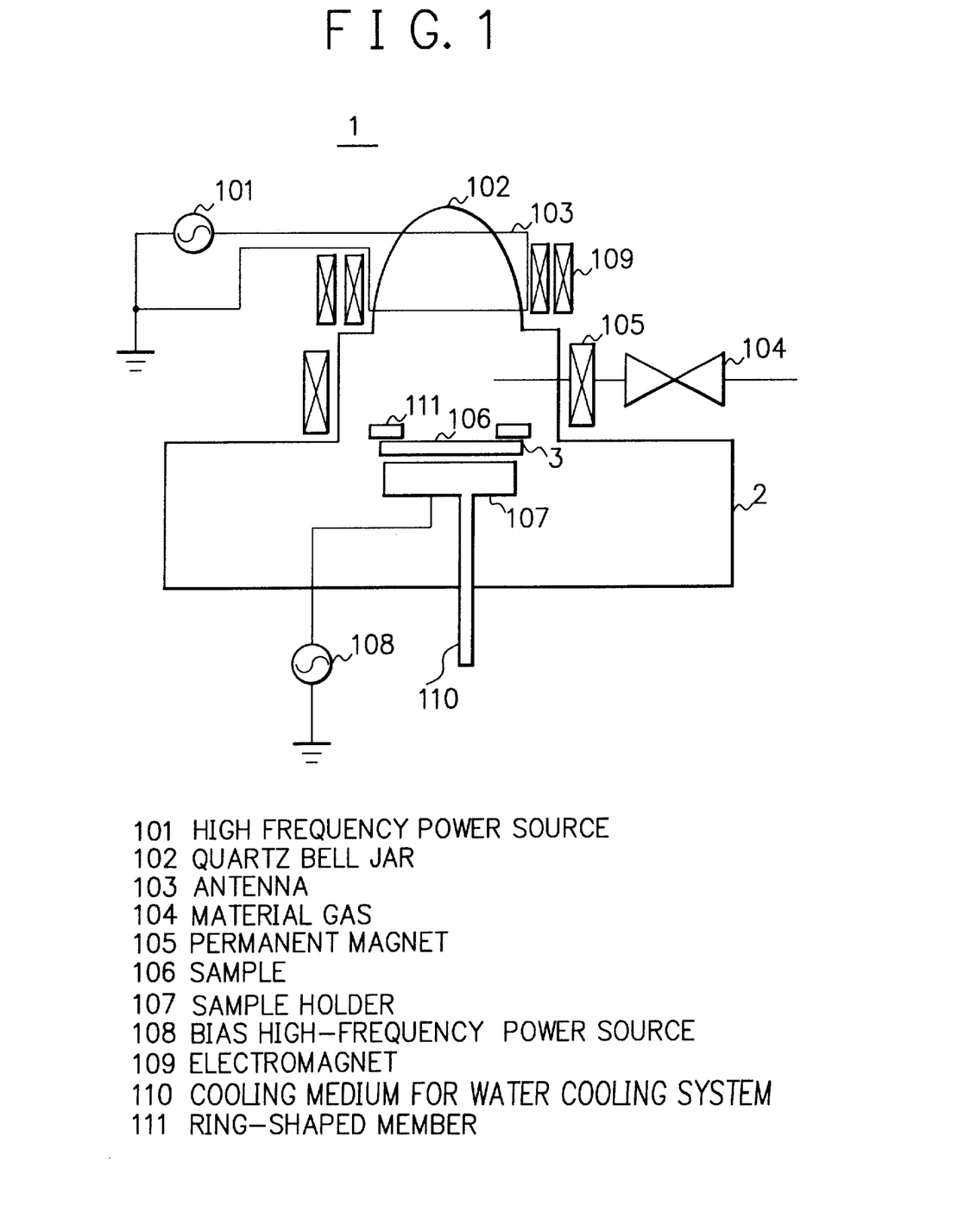
FIG. 1 is a side view showing constitution of a specific example of a film forming apparatus in accordance with the present invention.

FIG. 1 shows the overall structure of a CVD system in an embodiment of the present invention. This is a film forming apparatus 1 to be adopted in a semiconductor manufacturing process and includes a chamber for forming films such as a film of carbon compound on a substrate to be processed 106. At least arranged in the chamber 2 of the apparatus 1 are a holder unit 107 to hold the substrate 106 thereon, a ring-shaped member 111 disposed to oppose a surface 3 of the holder unit 107 on which the substrate 106 is to be mounted, the substrate 106 being fastened between the member 111 and the holder section 107; and a reactive gas supplying unit 104 to deliver a predetermined type of reaction gas to the chamber 2. The ring-shaped member 111 is dimensionally so constructed to have an inside diameter smaller than the outside diameter of the holder section 107 and an outside diameter larger than the outside diameter of the holder section 107. In the film forming apparatus 1, the member 111 concentrically covers the peripheral surface of the substrate 106 on the holder section 107 during the film forming process using the reactive gas.

Although not particularly limited to, the configuration of the holder section 107 desirably includes, for example, an electrostatic chuck in accordance with the present invention.

Thanks to the adoption of the electrostatic chuck, it is possible in this configuration, unlike that using the ring chuck unit of the Japanese Patent Laid-Open Serial No. 6-208959, to arrange the ring-shaped member 111 at a predetermined position with the member 111 being separated from the substrate 106 on the holder section 107.

Description will now be given of a procedure to form a film in the specific example above in accordance with the present invention.

The silicon wafer 106 as the objective substrate is introduced into a preparation chamber or room which is not shown and is arranged in a preceding stage of the plasma generating room, the preparation room being isolated by a gate valve, not shown. Air is evacuated from the preparation room and then the valve is opened to move the wafer 106 to the plasma generating room beforehand kept in a sufficient vacuum state. The wafer 106 is then mounted on the sample holder 107.

The gate valve is again closed to set the plasma generating room to a sufficient vacuum state. Thereafter, a gas of carbon oxide such as $CF_4$, $C_2F_6$, or $C_4F_8$ a gas of hydrogen carbide such as $CH_4$ or $C_2H_2$; or a mixture of these gases 104 is fed as a material gas into the plasma generating room.

In this situation, a high-frequency wave or a direct-current power is applied to the antenna to generate plasma so as to resultantly form a film of a amorphous carbon fluoride.

On the other hand, $SiH_4$ and $O_2$ are employed as the material gas 104 to form a film of silicon oxide while $SiH_4$ and $N_2$ or $NH_3$ are adopted as the material gas 104 to form a film of silicon nitride.

Figure 5:
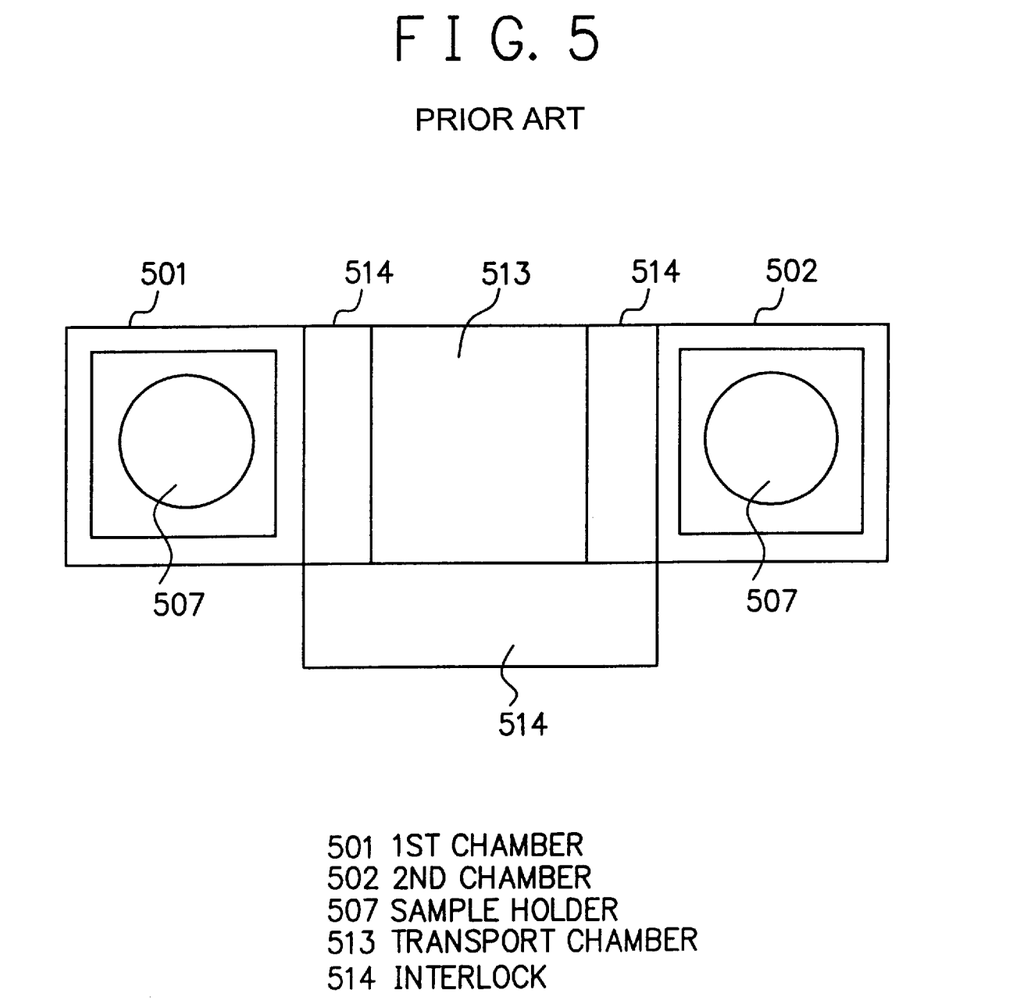
FIG. 5 is a side view showing an example of a multi-chamber apparatus for forming films of a semiconductor in accordance with the prior art.

In this regard, the apparatus for forming films of a semiconductor device in accordance with the present invention is called a multi-cluster system which includes, for example, two film forming rooms 501 and 502 as shown in FIG. 5.

In short, for example, a film of an amorphous carbon fluoride is formed in the film forming chamber 501 and a smoothed film is fabricated in the chamber 502. Thanks to this constitution, the number of films formed per unitary time can be increased. Moreover, after the film of amorphous carbon fluoride is formed, the film of silicon oxide can be formed thereon without exposing the carbon-fluoride film to atmosphere.

However, the present invention is not limited only to the multi-cluster system. Namely, the present invention is also applicable when the film of amorphous carbon fluoride, the film of silicon oxide, and the film of silicon nitride are respectively prepared by mutually different manufacturing apparatuses.

The configuration of the specific example shows an apparatus, which includes two chambers 501 and 502 to generate high-density plasma, for forming a film between layers, the film having a low inductive capacity. This example differs from the conventional apparatus in the structure of the wafer holding section in the chamber 501 to form a film of amorphous carbon fluoride. It is assumed that the configuration of the wafer holding section is similar to that described in conjunction with FIG. 6.

Figure 2:
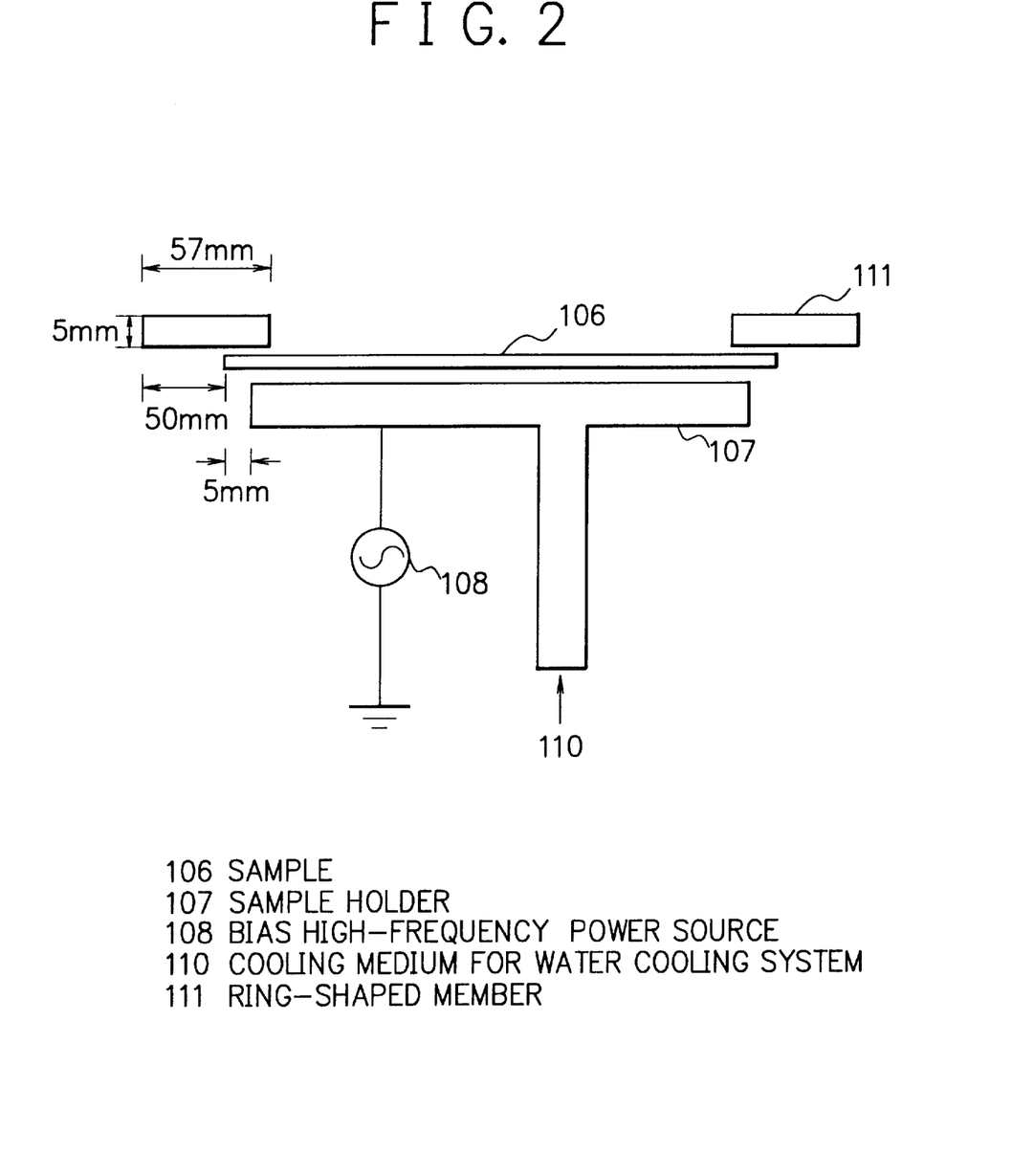
FIG. 2 is a side view showing a configuration of a holder section and a ring-shaped member utilized in a film forming apparatus in accordance with the present invention.

Description will now be given in detail of the construction of the film forming apparatus in the concrete example by referring to FIG. 2.

That is, a 6-inch silicon wafer 106 is mounted on the sample holder 107 of the substrate mounting plate in the processing room for the forming of a film of amorphous carbon fluoride. In this specific example, since the holder section includes an electrostatic chuck, the silicon wafer 106 is fixedly held by the electrostatic chuck of the sample holder 107.

The chuck desirably has a diameter 10 millimeters (mm) smaller than that of the wafer 106. As a result, the peripheral portion about 5 mm from the outer-most edge of the wafer 106 is not cooled.

The apparatus further includes a ring-shaped member 111 made of quartz to cover the peripheral portion of the silicon wafer 106. The member 111 has an outside diameter 100 mm larger than the diameter of the 6-inch wafer, i.e., the member 111 extends 50 mm outside the edge of the wafer 106. The member 111 has an inside diameter 14 mm smaller than the diameter of the wafer 106.

In short, the ring-shaped member 111 covers the portion of the wafer 106 about 7 mm from the out-most edge of the wafer 106. The member 111 has a thickness of about 5 mm for sufficient mechanical strength. This however will not restrict the present invention.

Using the ring-shaped member 111 in this concrete example, a film of amorphous carbon fluoride can be fabricated in a region on the silicon wafer 106, the region being smaller than that defined by the diameter of the electrostatic chuck of the sample holder 107.

The member 111 may be directly brought into contact with the wafer 106 as the objective substrate. However, the member 111 is preferably placed at a predetermined position not to be brought into contact with the silicon wafer 106.

Figure 3:
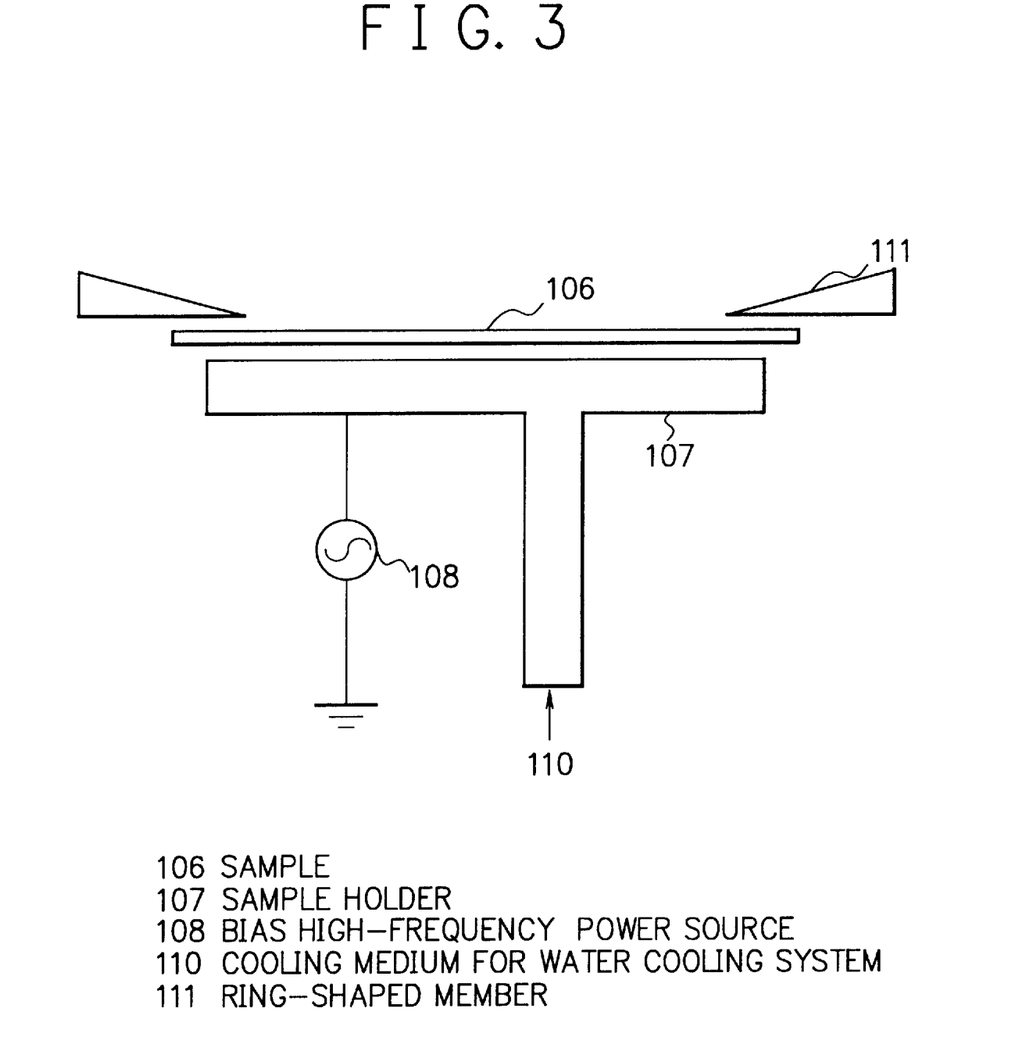
FIG. 3 is a side view showing structure of a ring-shaped member utilized in a specific example of the film forming apparatus in accordance with the present invention.

The ring-shaped member 111 has a cross section, although not particularly limited to, as shown in FIG. 3. Namely, a portion thereof, for example, either one of the surfaces other than one opposing to the silicon wafer 106 preferably includes a tapered end with a predetermined angle, e.g., 45°.

The tapered portion is effectively used to remove carbon compound fixed onto the member 111 in a cleaning process, which will be described later.

Furthermore, the ring-shaped member 111 adopted in this example is desirably movable in a direction vertical to the principal plane of the silicon wafer 106. Particularly, in the process to mount the wafer 106 onto the holder section 107, the process to remove the wafer 106 therefrom, or the cleaning process, the member 111 is desirably movable to be apart from the principal plane of the silicon wafer 106.

The valve is then closed. Thereafter, when the vacuum takes again a value in a range from about 10 torrs to about 8 torrs in the plasma generating room, the material gas 104 is introduced to the plasma generating chamber and then the vacuum is ordinarily adjusted to a value in a range from 0.01 torr to 0.05 torr. Under this condition, a high-frequency wave having a frequency of 13.56 megaherz (MHz) is applied to the plasma generating antenna 103 to resultantly form a film of amorphous carbon fluoride.

In this embodiment, there are disposed two film forming chambers each having a configuration similar to that of FIG. 1. The first chamber 501 is employed to form a film of amorphous carbon fluoride and the second chamber 502 is utilized to fabricate a film of silicon nitride.

In this constitution, there are continuously formed a film of silicon oxide and an insulation film having a low inductive capacity, the insulating film being inserted between other layers. In an apparatus in which the film of silicon oxide is formed by the chamber 502, the electrostatic chuck of the sample holder 107 may be of the same configuration as that of the prior art.

In the concrete example, the film of amorphous carbon fluoride is not formed in the periphery of the wafer. Therefore, in the forming of the film of silicon oxide, even when the peripheral region not to be cooled becomes equal to or more than 400° which the film of amorphous carbon fluoride can withstand, the peel-off of film can be prevented in the forming of the silicon-oxide film since the region does not include the film of amorphous carbon fluoride.

In this connection, as for the material of the ring-shaped member, to keep the state of plasma unchanged in this method like the conventional method not using any ring, an insulating material is used for the ring-shaped member.

In accordance with the present invention, quartz and alumina are employed for the ring-shaped member 111 to resultantly obtain a similar advantageous effect. It has been confirmed that the inside diameter of the member 111 need only be smaller than at least the diameter of the electrostatic chuck.

In this regard, most substances result from decomposition or reaction taking place in association with the reactive gas, for example, amorphous carbon fluoride piles or accumulates on the silicon wafer 106. However, a portion thereof fixes onto the ring-shaped member 111, particularly, a surface of an inner wall thereof.

When the film forming process is repeatedly accomplished, the thickness of the film coated onto the surface increases accordingly. The film adversely serves as dust in the subsequent film forming process, it is necessary to remove the film in a cleaning process.

Next, the cleaning process will be described. In this process, the ring-shaped member 111 is exposed to plasma in an atmosphere of oxygen.

As a result, the film of amorphous carbon fluoride piled on the side wall of the member 111 reacts with oxygen and is accordingly etched.

After the cleaning process is finished, the next film forming process is carried out.

In the cleaning process, when the member 111 is moved from the sample holder 107 about 3 cm and is thereafter exposed to plasma of oxygen atmosphere, the carbon film fixed onto a lower section of the member 111 can be removed.

Specifically, in a CVD process in which a 5000 Å thick film of amorphous carbon fluoride is formed on the semiconductor wafer, the carbon film fixed onto the ring-shaped member 111 can be completely removed by conducting the cleaning process for about three minutes after the film forming process is completed for one wafer under a condition of flow rate of oxygen=200 sccm, plasma power=3 kW, and pressure 2 mTorr.

When the cleaning is not carried out for each wafer, particles are detected on the ring-shaped member after 30 film forming processes, namely, after a 15 micron thick film of amorphous carbon fluoride is accumulated. That is, the cleaning is desirably conducted before the film forming process is conducted 30 times. The cleaning process takes about 90 minutes to completely remove the film of amorphous carbon fluoride from the ring-shaped member.

Subsequently, description will be given of a concrete example in which the ring-shaped member 111 is tapered.

As can be seen from FIG. 3, the ring-shaped member 111 is tapered to have a thickness of 5 mm at its outside edge and 0 mm at its inside edge. In this case, the area of the cross section of the member 111 exposed to the oxygen plasma is increased in cleaning process and there does not appear the area on the inner side wall thereof for which the cleaning speed is reduced, which leads to an efficient cleaning of the member.

Consequently, in a case in which the CVD process to form a 5000 Å thick film of amorphous carbon fluoride on the semiconductor wafer is repeatedly carried out for many semiconductor wafers under the condition described above, the cleaning of the film of amorphous carbon fluoride takes about three minutes when the member 111 is not tapered and about two minutes when the member 111 is tapered.

In accordance with the present invention, since the cleaning time of the ring-shaped member 111 is consequently decreased when compared with the prior art, the number of wafers to be processed per unitary time by the apparatus can be increased. Incidentally, on the outside side wall of the member 111 which is apart about 5 cm from the outer circumference of the wafer, there is not piled any carbon film at the pertinent region in the CVD system used in this example.

That is, the film forming process of the present invention is desirably achieved through the CVD process and the film of carbon compound between layers is favorably a film of carbon fluoride.

Additionally, the film of carbon fluoride between layers is favorable a film of amorphous carbon fluoride.

Moreover, in accordance with the present invention, the film forming process is favorably is at least a process in which a film of carbon compound is formed between layers on the substrate and an insulating film is accumulated on the carbon-compound film.

In addition, as described above, the ring-shaped member used in the present invention is favorably so configured to be movable in a direction vertical to the surface of the holder section at least when the cleaning process is carried out.

Subsequently, description will be given of constitution of another embodiment in accordance with the present invention.

The specific example of the configuration is a film forming apparatus for use in a semiconductor manufacturing process and includes a chamber to form a carbon-compound film between layers on a substrate to be processed. In the chamber 1, there are at least disposed a holder section to hold the substrate thereon and a reactive gas supplying unit to supply a predetermined kind of reactive gas into the chamber. The holder section includes an electrostatic chuck and another electrode connected to an outer circumferential edge of the chuck.

Figure 4:
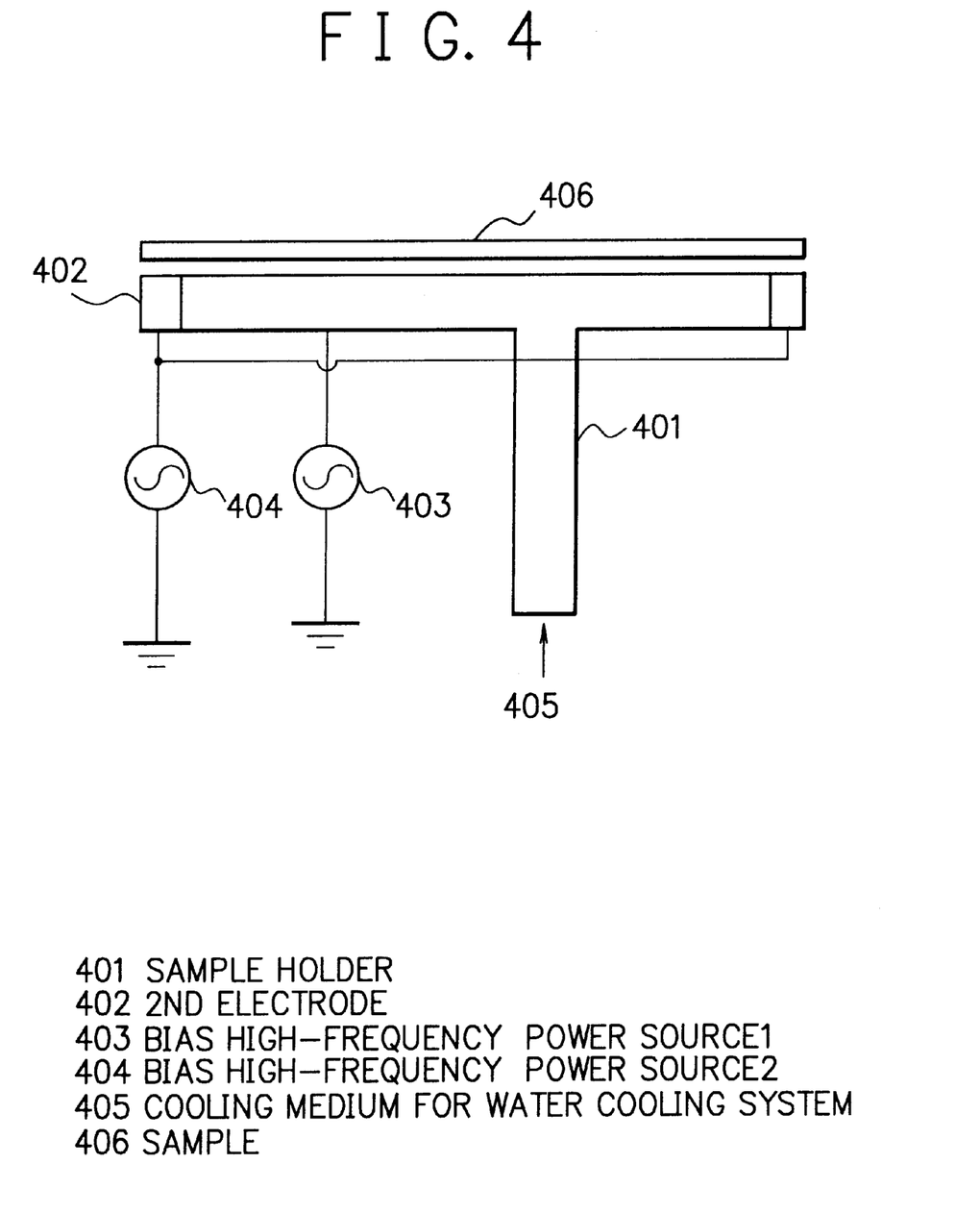
FIG. 4 is a side view showing an example of constitution of a holder section and electrodes used in another specific example of the film forming apparatus in accordance with the present invention.

Referring now to FIG. 4, description will be given of constitution of the concrete example in accordance with the present invention.

Since the ring-shaped member 111 is missing on the surface of a wafer 406 in this specific example, the cleaning process becomes quite simple. The sample 406 disposed in the processing chamber or room for the forming of a film of carbon compound between layers by use of, as in the example described above, a lower electrode 403 and an electrostatic chuck 401.

On an outer surface of the chuck 401, there is arranged a second electrode 402 made of SUS. Due to this configuration, it is possible to apply a high-frequency wave to the sample 406 in a separate manner. The second electrode 402 is brought into contact with an outer periphery of the chuck 401 also serving as a lower electrode. Namely, the outer periphery is extended 5 mm from an outer peripheral edge of the wafer 406.

Under this condition, a material gas is fed into the plasma generating chamber with the grade of vacuum set ordinarily to 0.01 to 0.05 Torr.

A 13.56 MHz wave is applied to the antenna 103 to cause a phenomenon of electric discharge to thereby form a film of amorphous carbon fluoride. In this process, a power is applied from a 400 kHz power source to the electrode 402 to generate a negative bias voltage on the electrode 402.

Resultantly, thanks to the bias voltage on electrode 402, there appear locally accelerated positive ions. These ions selectively sputter an area not cooled in the outer circumferential zone of the substrate.

When the speed of forming the carbon film is substantially equal to or less than the sputtering speed, the film is not formed on the outer circumferential zone. This leads to an effect substantially equivalent to that obtained when the ring-shaped member is utilized. In this embodiment, by applying a power of 500 W to the wafer 401, the film of amorphous carbon fluoride is not formed in the circumferential area of the wafer 401, the area being about 6 mm apart from the circumferential edge thereof.

Thanks to the provision, the peel-off can be prevented in the forming of the film of silicon oxide. Additionally, the film does not pile on the SUS electrode after the film forming process, and the electrode is not deteriorated after 100 wafers are processed.

In short, in accordance with the specific example of the present invention, there is arranged a second electrode separately with respect to the holder section 401 including an electrostatic chuck and also serving as an electrode so that a bias voltage is applied to the second electrode.

Figure 7:
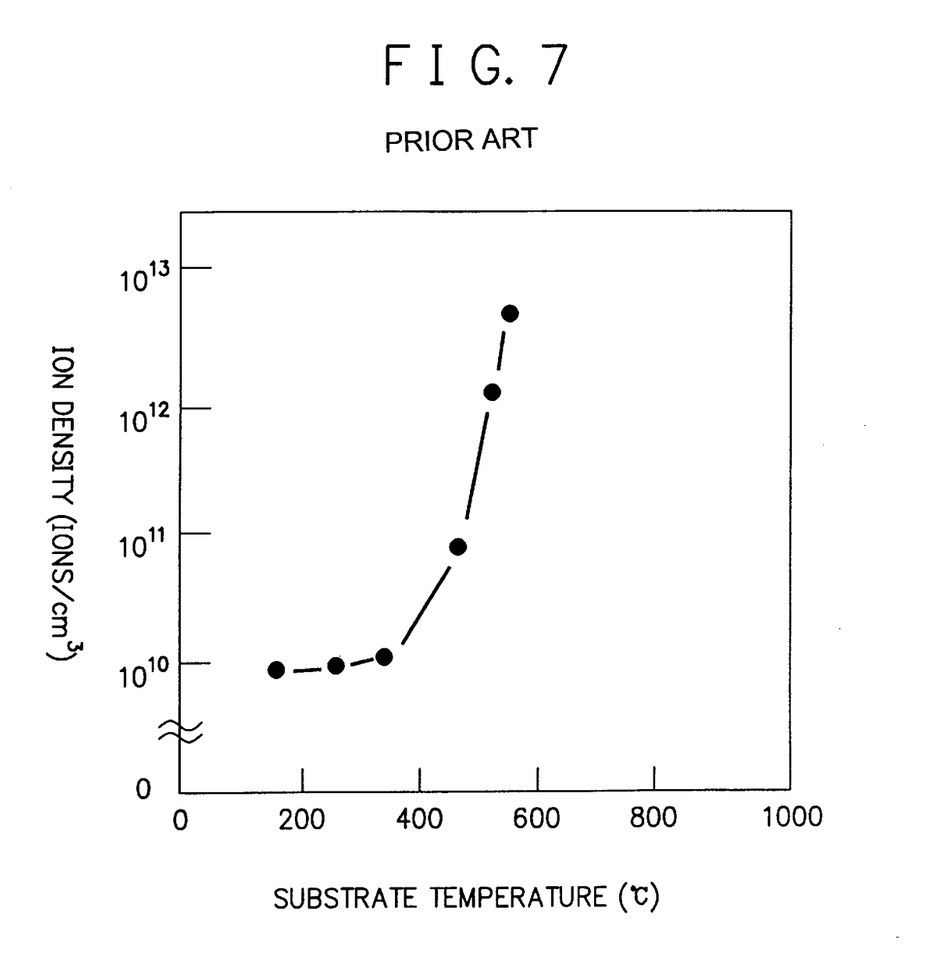
FIG. 7 is a graph showing dependence of the plasma density on the substrate temperature in the CVD system.

Referring next to FIGS. 5 and 7, description will be given in detail of still another embodiment in accordance with the present invention.

FIG. 5 shows structure of a concrete example of a multi-chamber system in which each module of vacuum chamber is a CVD reaction chamber as described above.

Namely, this example of the semiconductor fabricating system is a multi-chamber apparatus for use in a semiconductor manufacturing process to form an insulating film and the like on a substrate to be processed. The apparatus includes at least two chambers including a first chamber and a second chamber. Each chamber including a holder section to hold the substrate thereof and a reactive gas supplying unit to deliver a predetermined type of reactive gas into the chamber. The first chamber is adopted to form a film of carbon compound while the second chamber is used to form a film of silicon oxide or nitride. The second chamber has a plasma density less than that of the first chamber. For example, the second chamber includes a plasma source of a parallel plate type.

As can be seen from FIG. 5, this example is a multi-chamber semiconductor manufacturing apparatus including a first chamber 501 connected to a transport chamber 513 for forming a film of amorphous carbon fluoride and a second chamber at least including a film forming device of a parallel plate type, the second chamber 502 having a plasma density of $5 \times 10^9$ units/cm$^3$. The apparatus includes a vacuum system separated by an interlock from the first and second chambers 501 and 502.

Namely, in accordance with the example, the plasma density of the second chamber 502 to form a silicon-oxide film after the forming of the film of amorphous carbon fluoride is less than that of the first chamber 501 to form the film of amorphous carbon fluoride.

In this regard, FIG. 7 shows a relationship of the plasma density to the substrate temperature when the substrate is not cooled in the forming of the silicon-oxide film.

By setting the plasma density to a value equal to or less than $2 \times 10^{10}$ units/cm$^3$, the increase in the sample or substrate temperature can be lowered to about 400° C. or less even when the substrate is not cooled in the film forming process. Therefore, the temperature in the outer circumferential zone of the wafer is equal to or less than 400° C. and the film of amorphous carbon fluoride is not decomposed, which prevents the peel-off of the film.

Although the multi-chamber system is employed in this example, it is only necessary to suppress the temperature increase in the process of piling a film of silicon oxide or nitride on the film of amorphous carbon fluoride and hence the present invention is also applicable even when the first chamber to form the film of amorphous carbon fluoride is separated from the second chamber to fabricate the silicon-oxide film.

Description will now be given of a semiconductor which includes a carbon compound film partly in its multi-layer wiring region and which is manufactured by a semiconductor fabricating apparatus using the constituent devices and apparatuses described above. Since the film of amorphous carbon fluoride is not piled on the circumferential zone of the wafer, the wafer temperature is not increased when the silicon-oxide film is fabricated after the film of amorphous carbon fluoride, which hence prevents the peel-off of the film. This makes it possible to minimize the number of particles as compared with the conventional technology. Consequently, the number of wafers processed per unitary time is increased and the yield is improved as a result.

In a further alternative concrete example of the present invention, the film of amorphous carbon fluoride is formed up to the circumferential edge of the wafer without using the ring-shaped member. Thereafter, a plasma CVD system of a parallel plate type with a low plasma density is employed to form the film of silicon oxide or nitride so as to resultantly obtain a similar advantageous effect.

That is, this concrete example of the semiconductor fabricating system is a multi-chamber apparatus for use in a semiconductor manufacturing process to form an insulating film and the like on a substrate to be processed. The apparatus includes at least two chambers including a first chamber and a second chamber. Each chamber including a holder section to hold the substrate thereof and a reactive gas supplying unit to deliver a predetermined type of reactive gas into the chamber. The first chamber is employed to form a film of carbon compound and the second chamber is adopted to form a film of silicon oxide or nitride. The first chamber includes a plasma source of a parallel plate type; moreover, the second chamber also includes a plasma source of a parallel plate type.

As can be seen from the description above, in a specific example of a method of manufacturing a semiconductor device in accordance with the present invention, there is employed, for example, a chamber including a holder section to hold a substrate to be processed and a reactive gas supplying unit to feed a predetermined kind of reactive gas into the chamber to thereby form a carbon compound film between layers. In the process to form the carbon compound film by supplying the reactive gas onto the substrate, the carbon-compound film is fundamentally prevented from being formed in the outer circumferential zone of the substrate in the film forming process. In the semiconductor manufacturing method, it is favorable to arrange a ring-shaped member which is brought into contact with an outer circumferential edge of the substrate held by the holder section such that the ring-shaped member retains the substrate mounted on a portion of the holder section. In the film forming process conducted on the substrate by the reactive gas, the ring-shaped member concentrically covers the outer circumferential zone of the surface of the substrate.

Additionally, in the concrete example, it is also possible that the holder section to keep the substrate includes an electrostatic chuck and the holder section is connected to an outer circumferential edge of the chuck. Moreover, there is provided a second electrode such that a bias voltage is applied to the second electrode. In the example of the thin film forming method of manufacturing a semiconductor device including as insulating films between layers at least a carbon-compound film and a film of silicon oxide or nitride, the region of a silicon substrate on which the carbon compound is to be accumulated may be smaller than that on which the silicon oxide or nitride is to be piled.

As the method of forming thin films of the semiconductor device in accordance with the present invention, there may be employed a thin film forming method of manufacturing a semiconductor device including as insulating films between layers at least a carbon compound film and a film of silicon oxide or nitride in which the plasma density of the plasma source to pile the silicon oxide or nitride on the silicon substrate is less than that of the plasma source to accumulate the carbon compound film in the film forming process.

As above, in accordance with the present invention, there is provided a configuration of an apparatus for forming a film of amorphous carbon fluoride in which the film of amorphous carbon fluoride is not formed in the peripheral region of the substrate or a film forming apparatus in which the temperature in the film forming process is equal to or less than a temperature which the film of amorphous carbon fluoride withstands. Thanks to the present invention, the peel-off of the film is prevented in the peripheral region of the wafer.

In accordance with the present invention, there is provided a film forming apparatus in which a substrate as an object of the process is mounted on a substrate plate in a processing chamber of the apparatus. Thereafter, a peripheral surface of the substrate is covered by a ring-shaped member having an inside diameter smaller than the diameter of the electrostatic chuck such that the film is not formed on a predetermined area of the circumferential zone of the substrate thereby limiting the film forming range. Alternatively, the substrate temperature of the peripheral of the substrate is set to be different from that of a central portion of the substrate and/or the bias voltage is varied between the peripheral and central portions of the substrate to thereby prevent the film forming on a predetermined area of the circumferential zone of the substrate.

Moreover, in accordance with the present invention, there is provided an apparatus for manufacturing a semiconductor device including a plasma film forming device of a parallel plate type in which the substrate temperature is not increased in the forming of the silicon oxide or nitride film on the carbon compound film between layers.

Consequently, when forming the film of silicon oxide or nitride on the film of amorphous carbon compound, the wafer temperature in any region thereof is equal to or less than a temperature which the film of amorphous carbon compound withstands. This prevents decomposition of the film of amorphous carbon compound.

As a result, there is prevented the peel-off of the silicon-oxide film due to an etching gas of CF type generated when the film of amorphous carbon compound is decomposed and hence the peel-off the film is prevented in the peripheral region of the wafer.

Furthermore, by employing the semiconductor manufacturing apparatus of the present invention in the fabrication of the multi-layer wiring structure of a semiconductor, the number of particles resultant from the peel-off can be reduced when compared with the prior art and the yield can be improved.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A film forming apparatus for use in a semiconductor manufacturing process including a chamber in which a carbon compound film is formed on a substrate to be processed, wherein the chamber at least includes:

a holder section comprising an electrostatic chuck operably connected to a first power source, for holding the substrate thereon; and reactive gas supplying means for supplying a predetermined type of reactive gas into the chamber, and a peripheral electrode in constant contact with a peripheral portion of said electrostatic chuck and operably connected to a second power source different from said first power source.

2. A film forming apparatus in accordance with claim 1, wherein the second electrode is applied with a bias voltage.

3. A film forming apparatus in accordance with claim 1 wherein said second power source establishes a negative bias on said periphery of said substrate.

4. A multi-chamber semiconductor manufacturing apparatus for use in a semiconductor manufacturing process comprising:

at least two chambers, each chamber being disposed to form an insulation film on a substrate and including a holder section for holding the substrate thereon and reactive gas supplying means for supplying a predetermined type of reactive gas into the chamber, the first chamber being operable to form a film of carbon compound on said substrate and including a high-density plasma source, and the second chamber being operable to form a film of silicon oxide or nitride on said substrate and having a plasma density lower than that of the first chamber, said second chamber including a plasma source of a parallel plate type.

5. A film forming apparatus for use in a semiconductor manufacturing process including a chamber in which a carbon compound film is formed on a substrate to be processed, wherein the chamber at least includes:

a holder section for holding the substrate thereon;

a ring-shaped member disposed to oppose a surface of the holder on a side thereof on which the substrate is mounted, the ring-shaped member holding the substrate in cooperation with the holder; and reactive gas supplying means for supplying a predetermined type of reactive gas into the chamber, the ring-shaped member dimensionally having an inside edge with an inside diameter smaller than an outside diameter of the holder section and an outside edge with an outside diameter larger than the outside diameter of the holder section and an upper surface with a constant slope extending from said outside edge to said inside edge, and the ring-shaped member concentrically covering, during a film forming process with the reactive gas, a circumferential region of a surface of the substrate mounted on the holder section.

6. A film forming apparatus in accordance with claim 5 wherein said constant slope is about 45°.

7. A film forming apparatus in accordance with claim 5 wherein said upper surface extends from said outside edge having a non-zero thickness to said inside edge having a zero thickness.

8. A film forming apparatus in accordance with claim 5 wherein said ring-shaped member is made from quartz or aluminum.

9. A film forming apparatus in accordance with claim 5 wherein said ring-shaped member further comprises a bottom surface opposing said upper surface and wherein said bottom surface is movable to be in constant contact with a peripheral portion of said substrate.

10. A film forming apparatus in accordance with claim 5 wherein the holder section includes an electrostatic chuck.

11. A film forming apparatus in accordance with claim 5 wherein the holder section includes a tapered portion.

12. A film forming apparatus in accordance with claim 5 wherein the film forming process includes chemical vapor deposition.

13. A film forming apparatus in accordance with claim 5 wherein the carbon compound film is a film of carbon compound containing fluoride.

14. A film forming apparatus in accordance with claim 5 wherein the carbon compound containing fluoride includes a film of carbon fluoride.

15. A film forming apparatus in accordance with claim 5 wherein the film forming process at least includes a process of forming the film of carbon compound on the substrate and an insulation film accumulated on the film of carbon compound.

16. A film forming apparatus in accordance with claim 5 wherein the ring-shaped member is movable in a direction vertical to a surface of the holder section at least when a cleaning process is executed.

* * * * *